United States Patent
Moon

(10) Patent No.: US 7,535,581 B2
(45) Date of Patent: May 19, 2009

(54) NANOMETER-LEVEL MIX-AND-MATCH SCANNING TIP AND ELECTRON BEAM LITHOGRAPHY USING GLOBAL BACKSIDE POSITION REFERENCE MARKS

(75) Inventor: Euclid E. Moon, Boston, MA (US)

(73) Assignee: Massachusetts Institute of Technology, Cambridge, MA (US)

(*) Notice: Subject to any disclaimer, the term of this patent is extended or adjusted under 35 U.S.C. 154(b) by 0 days.

(21) Appl. No.: 11/850,982

(22) Filed: Sep. 6, 2007

(65) Prior Publication Data
US 2008/0055607 A1    Mar. 6, 2008

Related U.S. Application Data

(60) Provisional application No. 60/842,602, filed on Sep. 6, 2006.

(51) Int. Cl.
G01B 11/02 (2006.01)
(52) U.S. Cl. .................................. 356/501; 356/508
(58) Field of Classification Search ................. 356/499, 356/501, 505, 508
See application file for complete search history.

(56) References Cited

U.S. PATENT DOCUMENTS 5,136,169 A   8/1992  Smith et al.
5,414,514 A   5/1995  Smith et al.
6,088,103 A   7/2000  Everett et al.
6,437,347 B1  8/2002  Hartley et al.
6,522,411 B1  2/2003  Moon et al.
6,882,477 B1  4/2005  Schattenburg et al.

FOREIGN PATENT DOCUMENTS

WO   2007121300   10/2007

OTHER PUBLICATIONS

Moon et al., "Interferometric-spatial-phase imaging for six-axis mask control" Journal of Vacuum Science and Technology: Part B, AVS/AIP, Melville, New York, NY, vol. 21 No. 6, Dec. 10, 2003, pp. 3112-3115, XP002453014, pp. 3112-3115.
Moon et al., "Dynamic alignment control for fluid-immersion lithographies using interferometric-spatial-phase imaging" J. Vac. Sci. Technology B 2005 American Vacuum Society, pp. 2607-2610.

*Primary Examiner*—Tarifur Chowdhury
*Assistant Examiner*—Jonathon D Cook
(74) *Attorney, Agent, or Firm*—Gauthier & Connors LLP

(57) ABSTRACT

An interferometric-spatial-phase imaging (ISPI) system includes a substrate wafer. An alignment configuration is permanently embedded in the substrate wafer. The alignment configuration uses a global coordinate reference system by providing a plurality of global reference marks that encompass up to the entire substrate wafer. A plurality of alignment markings is provided on a surface in close proximity to the alignment configuration for obtaining continuous six-axis control to provide positional information of a scanning probe tip or an electron beam with respect to said global coordinate reference system.

20 Claims, 6 Drawing Sheets

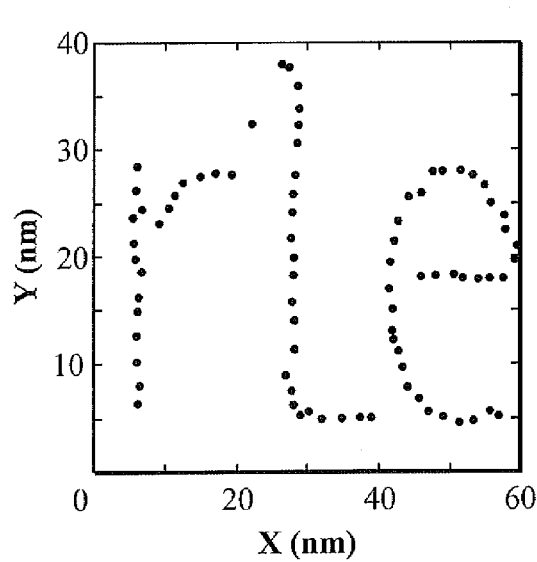
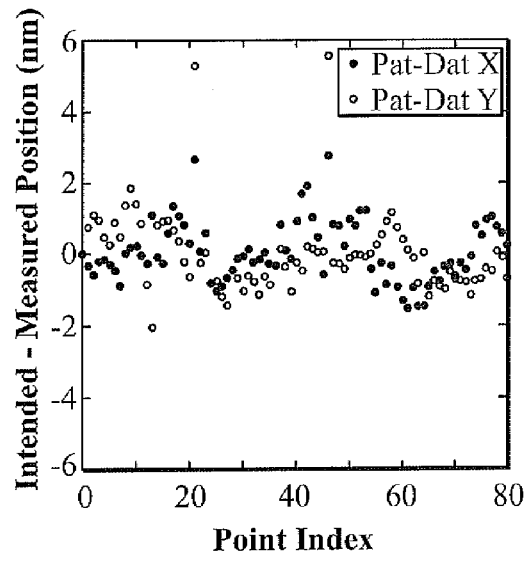
FIG. 4A
FIG. 4B
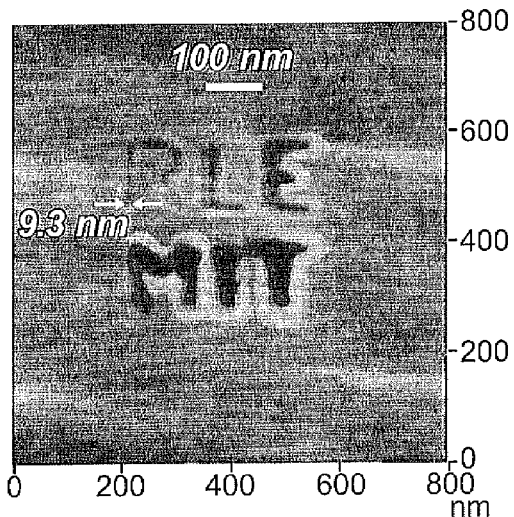
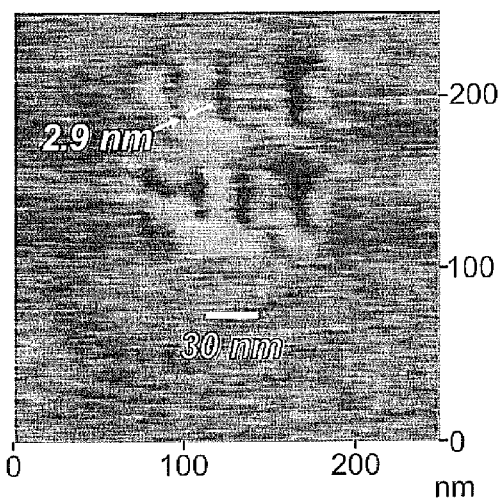
FIG. 5A
FIG. 5B

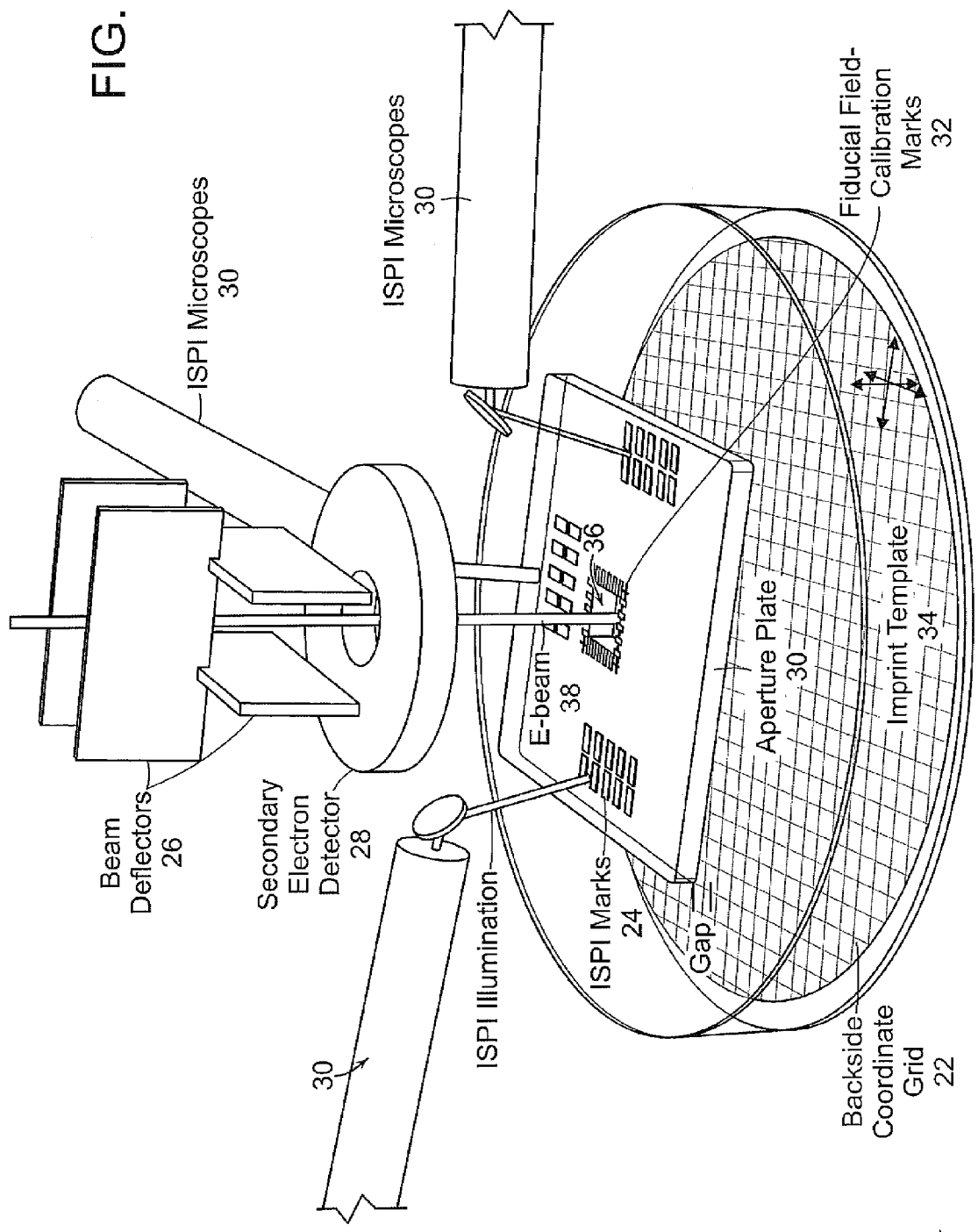

NANOMETER-LEVEL MIX-AND-MATCH SCANNING TIP AND ELECTRON BEAM LITHOGRAPHY USING GLOBAL BACKSIDE POSITION REFERENCE MARKS

PRIORITY INFORMATION

This application claims priority from provisional application Ser. No. 60/842,602 filed Sep. 6, 2006, which is incorporated herein by reference in its entirety.

BACKGROUND OF THE INVENTION

The invention relates to the field of scanning tip and electron beam lithography, and in particular nanometer-level mix-and-match scanning tip and electron beam lithography using global backside position reference marks.

Previous forms of infrared alignment used conventional alignment marks, such as crosses and boxes, and were imaged with conventional optics. Resolution using conventional imaging techniques is limited to approximately λ/2. To view backside alignment marks, infrared illumination is required. At the longer, infrared wavelengths, resolution degrades, typically to 500 nm or more. In a special case, signal processing was applied to such low-resolution images to improve resolution in a 1000 nm-resolution infrared imaging system, signal processing techniques extended matching precision of a known pattern to infrared images within ~100 nm, which is still insufficient for many applications.

Moreover, U.S. Pat. No. 5,136,169 describes the use of fiducial patterns written on a layer on top of an e-beam resist, for the purpose of detecting the position of the e-beam relative to the substrate, and correcting e-beam position drift. U.S. Pat. No. 6,882,477 describes a method for nanometer-precision formation of periodic patterns, for fabrication of large-area periodic structures. U.S. Pat. No. 6,437,347 describes a target-locking system for electron beam lithography, but uses a dual-frequency laser stage interferometer to relate the position of a target plate to a substrate stage, and is unable to relate the position of e-beam-written patterns to patterns written by a scanning tip.

SUMMARY OF THE INVENTION

According to one aspect of the invention, there is provided an interferometric-spatial-phase imaging (ISPI) system. The ISPI system includes a substrate wafer. An alignment configuration is permanently embedded in the substrate wafer. The alignment configuration uses a global coordinate reference system by providing a plurality of global reference marks that encompass up to the entire substrate wafer. A plurality of alignment markings is provided on a surface in close proximity to the alignment configuration for obtaining continuous six-axis control to provide positional information of a scanning probe tip or an electron beam with respect to the global coordinate reference system.

According to another aspect of the invention, there is provided a method of measuring alignment in an interferometric-spatial-phase imaging (ISPI) system. The method includes providing a substrate wafer. Also, the method includes permanently embedding an alignment configuration in the substrate wafer. The alignment configuration uses a global coordinate reference system by providing a plurality of global reference marks that encompass up to the entire substrate wafer. Furthermore, the method includes providing a plurality of alignment markings on a surface in close proximity to the alignment configuration for obtaining continuous six-axis control to provide positional information of a scanning probe tip or an electron beam with respect to the global coordinate reference system.

BRIEF DESCRIPTION OF THE DRAWINGS

FIGS. 4A-4B are graphs illustrating arbitrary pattern trajectory of a scanning tip using ISPI tip control;

FIGS. 5A-5B are AFM scans of patterns with sub-10 nm features written by a scanning tip;

FIG. 6 is a schematic diagram illustrating electron-beam position control used in accordance with the invention.

DETAILED DESCRIPTION OF THE INVENTION

The present invention involves a technique to unify placement accuracy of scanning-tip and e-beam lithography on the nanometer level, together with alignment and overlay of templates and wafers. Nanometer placement accuracy is required for practical fabrication of devices and structures containing sub-10 nm features.

Figure 1:
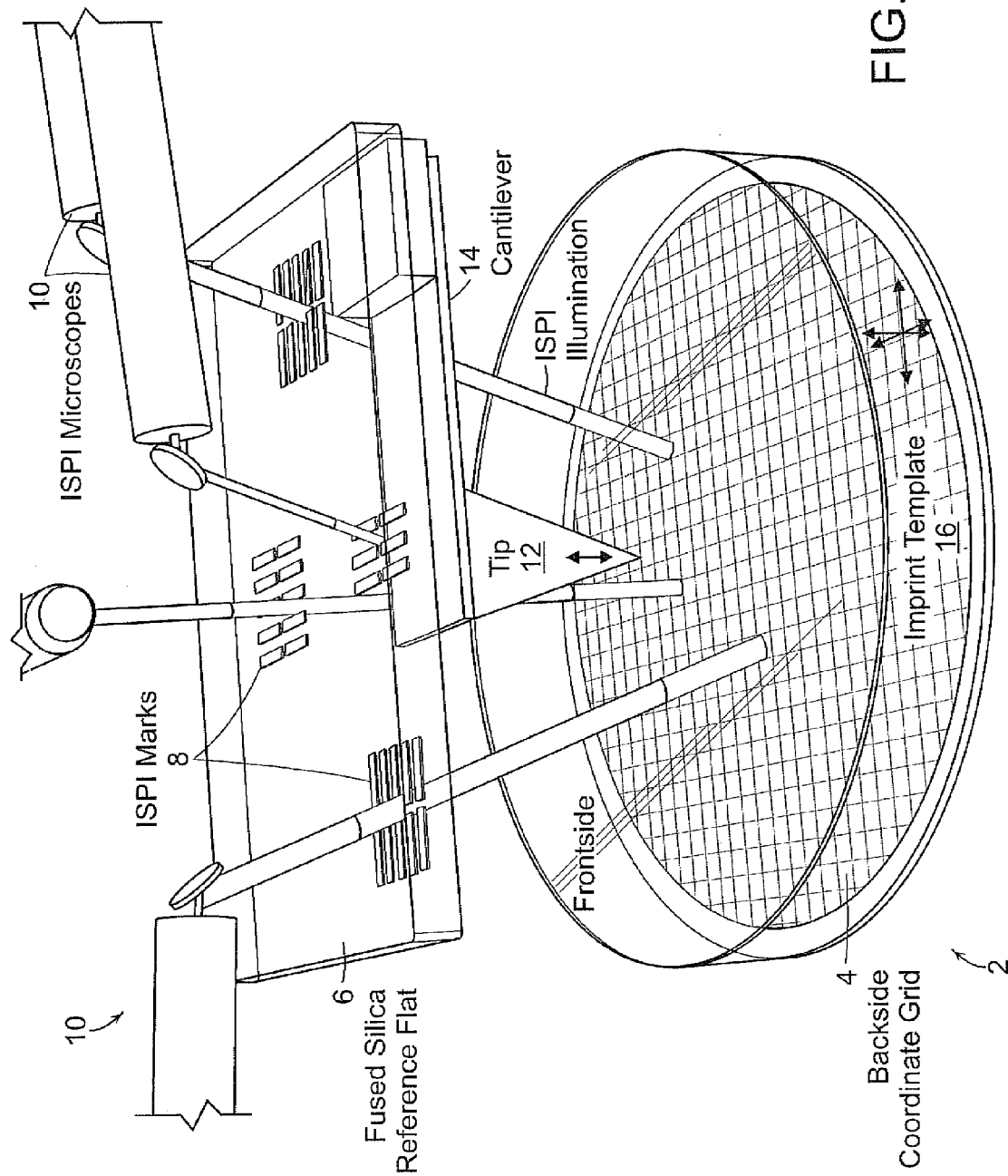
FIG. 1 is a schematic diagram of an interferometric-spatial-phase imaging (ISPI) arrangement in accordance with the invention.

FIG. 1 is a schematic diagram of interferometric-spatial-phase imaging (ISPI) arrangement 2 in accordance with the invention having a probe tip 12 being attached to a planar support structure, such as a fused silica plate, called a reference flat 6, containing grating patterns or interferometric-spatial-phase imaging (ISPI) markings 8. Checkerboard marks 4 form complementary patterns across the back surface of a substrate, such as an imprint template 16, as illustrated in FIG. 1. The ISPI marks 8 are illuminated with spatially-coherent light at an oblique angle using the ISPI microscopes 10 and interference patterns encoding position are detected with darkfield ISPI microscopes 10 at a similar angle. The checkboard marks 4 are illuminated with light at a wavelength to which the substrate 16 is transparent or infrared light in the silicon transparency band. Also, the checkboard marks 4 provide zero footprint for marks on the frontside of the substrate 16.

ISPI marks 8 are used to detect X and Y position as well as gap between a reference plate 6 and the substrate 16. The probe tip 12 is attached to the reference plate 6 with a small gap between the cantilever 14 and the plate 6, allowing tip deflection to be detected by another ISPI microscope 10, observing gapping marks above the cantilever 14. The scanning tip 12 modifies a surface layer on the substrate 16, under continuous ISPI position control.

The gap between the reference flat and the substrate is also monitored by ISPI microscopes, as described in U.S. Pat. No. 6,522,411, which is incorporated herein by reference. Gapping marks are viewed by the same camera, and in the same field of view, as the lateral position detection marks. All six degrees of freedom (X, Y, Z, $\theta_x$, $\theta_y$, $\theta_z$) can be measured or derived simultaneously with three ISPI microscopes 10, as described in U.S. Pat. No. 6,522,411, which is incorporated herein by reference. Tip height relative to the reference flat is detected using another ISPI microscope and interferometric gapping marks above the cantilever.

Figure 2:
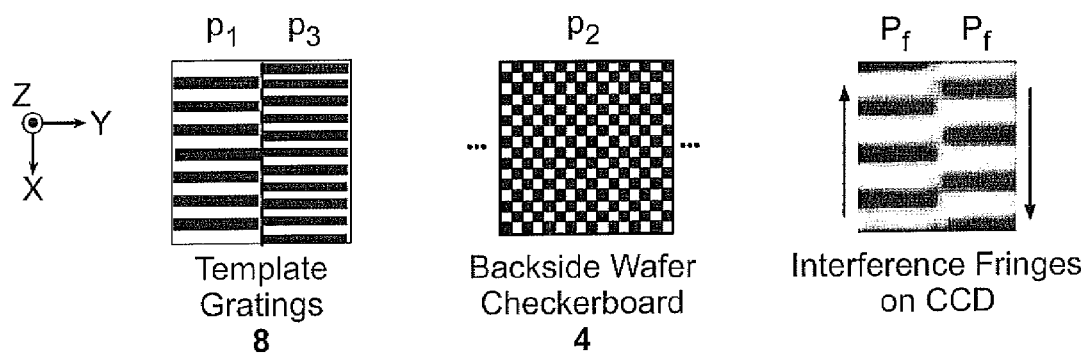
FIG. 2 is a schematic diagram illustrating designs of interferometric-spatial-phase imaging (ISPI) marks used with a template and the backside of a wafer.

The design of interferometric-spatial-phase imaging (ISPI) marks includes of markings 8 with period p1 and p3 on a template in proximity to a wafer with markings 4 with period p2, as shown in FIG. 2. The checkerboard marks 4 typically cover the entire wafer backside and have a period of p2 in two orthogonal directions. FIG. 2 shows template gratings 8 for detecting displacement along the X direction. Y detection is done with marks identical to the shown template marks 8, but in the orthogonal direction. X and Y detection are performed using the same checkerboard marks 4.

The CCD image of the interference fringes that result from superposition of template and wafer marks illustrates this point. In the preferred embodiment, $p_1$=1.525 μm, $p_2$=1.500 μm, and $p_3$=1.475 μm. Interference fringes are generated through multiple diffractions and subsequent interference, as described in U.S. Pat. Nos. 5,414,514 and 6,088,103, which are incorporated herein by reference, and enable position detectivity on the sub-angstrom level. This technique is referred to as Interferometric-Spatial-Phase Imaging (ISPI).

Unambiguous position information from the interferometric fringes are resolved using spatial frequency analysis of a variable-period, or chirped, array of backdiffracting marks or periodic marks on a template.

Figure 3B:
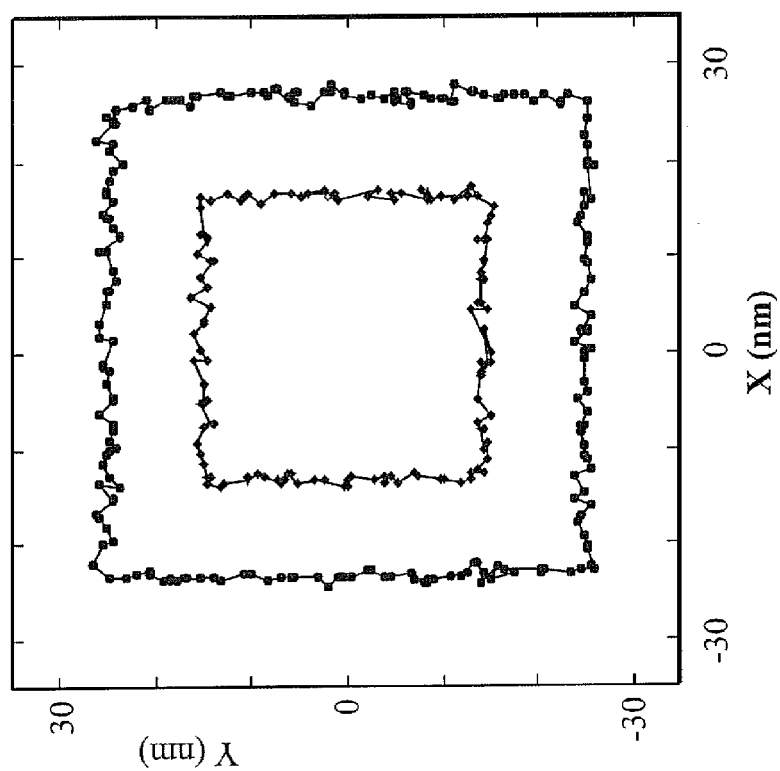
FIGS. 3A-3B are graphs illustrating experimental data showing the ability to control the position of a scanning tip using ISPI, compared with tip control using a capacitive-sensor closed-loop piezo.
Figure 3A:
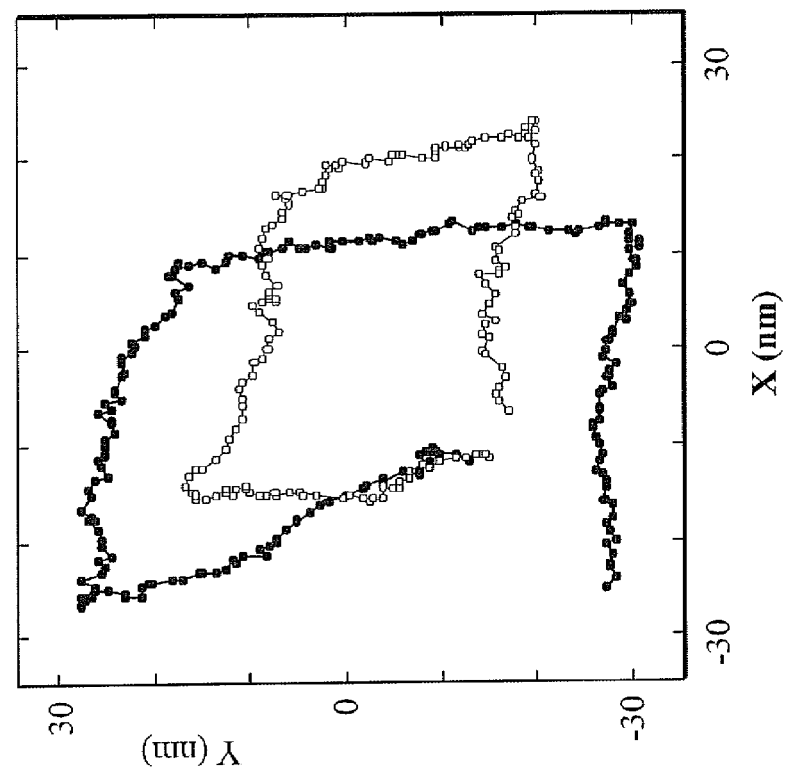

During lithography, the substrate 16 is scanned underneath the tip in X and Y directions, while the tip height is modulated with a Z piezo, attached between the reference flat and the probe cantilever. Throughout the X-Y scan by the substrate, the position of the reference flat 6 and hence the tip position is referenced to the substrate position using the ISPI marks 8, allowing continuous correction for thermal drift and other errors. FIGS. 3A-3B show experimental data showing the ability to control the position of a scanning tip using ISPI, compared with tip control using a capacitive-sensor closed-loop piezo.

In particular, FIG. 3A shows the comparison of the tip trajectory under conventional closed-loop piezoelectric control and FIG. 3B shows the ISPI feedback control. In both cases the trajectory is tracked by ISPI. The commanded tip trajectory is the same in both examples. Frontside substrate marks were used in this example to demonstrate the principle of ISPI tip control, however, backside substrate marks will exhibit no loss of detectivity.

The tip writes arbitrary patterns, while under continuous position control. FIGS. 4A-4B show an arbitrary pattern trajectory of a scanning tip, using ISPI tip control. In particular, FIG. 4A shows a graph of an arbitrary tip trajectory under ISPI control during a tip trace of an arbitrary pattern. FIG. 4B is a graph demonstrating the disparity between intended and measured points along the tip trajectory. In X the mean=0.08 nm and σ=0.86 nm; in Y the mean=0.00 nm and σ=1.13 nm. The point index origin is at the base of the "r".

Examples of patterns with sub-10 nm features written by a scanning tip are shown in FIGS. 5A-5B. FIG. 5A shows AFM scans of sub-10 nm features inscribed in PMMA on a fused-silica imprint template with a tungsten tip and FIG. 5B shows AFM scans of sub-10 nm features inscribed in PMMA on a fused-silica imprint template with a diamondoid tip. The lithography was performed in a Veeco Dimension 3000 AFM.

The position of an electron beam (E-beam) 38 is controlled with respect to global position reference marks 22 on the back surface of a substrate having templates or wafers 34, as shown in FIG. 6. Moreover, FIG. 6 is a schematic diagram of electron microscope arrangement 20 in accordance with the invention having an aperture plate 30 at a small gap above the substrate 34 having interferometric (ISPI) marks 24 that are complementary to the global backside marks 22, and produce interference fringe patterns that are detected by darkfield optical microscopes 31. The microscopes 31 detect the position of the plate in X, Y, Z, as well as tilt, tip and rotation.

The aperture plate 30 remains substantially fixed, and the substrate 34 is stepped from field to field underneath the aperture plate 30. The aperture plate 30 includes an aperture 36 that allows the e-beam 38 an unobstructed passage to expose a thin film on the front surface of the substrate 34, within an area designated as a field. The e-beam 38 is guided thru the aperture 36 using beam deflectors 26. The dimensions of the aperture 36 are similar, but not less than, the size of a single exposure field. Field-calibration marks 32 are fixed at the periphery of the aperture 36, and are used for calibration of the e-beam pattern placement immediately prior to exposure of each exposure field. Marks 32 placed around the periphery of the aperture 36 also facilitate intermittent verification of beam position during exposure of a pattern.

The aperture plate 30 is of sufficient thickness and composition to eliminate passage of electrons through the plate during any part of the field-calibration process. No exposure of the resist on the substrate 34 occurs during the field calibration. The top surface of the plate 30 includes a conducting coating and a ground path to prevent charging.

When exposure on one field is completed, the substrate 34 stage moves to a new field, and locks to the new position using the global backside marks 22. Prior to exposure, a new field calibration procedure is performed on the peripheral marks. During exposure, the e-beam 38 can be scanned outside the field area to the marks 32 on the periphery of the aperture 36 to verify or fine-tune the e-beam position. Beam position is detected by means of secondary or backscattered electrons from the high-Z material of the peripheral marks 32. If the e-beam 38 is raster scanned, the position verification can be performed at the beginning and end of every scan line.

In the case of a vector scan, the position verification can be performed intermittently, as necessary. The process is repeated for every field covering the substrate 34. Field-stitching errors are reduced to the nanometer or sub-nanometer level by the interferometric position locking of the plate 30 with respect to the global backside marks. Intrafield errors are reduced to the nanometer or sub-nanometer level by the initial pre-exposure calibration of the e-beam position to the peripheral marks 32 and the intermittent position verification to the marks around the periphery of each exposed field.

The mark and ISPI microscope configuration used for e-beam control can be identical to those used for scanning-tip control.

In an alternate embodiment, a full e-beam field 38 is calibrated by a two-dimensional periodic mark using a localized fiducial grid fixed to the front surface of the aperture plate 30, adjacent to the aperture 36. The aperture plate 30 is moved, under ISPI control, to position the fiducial grid under the axis of the electron beam. The e-beam 38 is scanned over the grid and the position of the beam 38 during the scan is obtained using the secondary electron detector 28. A map of the disparity between the intended and actual beam position is generated in this manner and used to correct the beam position during exposure of the field (with the aperture 38 realigned to the beam axis, under ISPI control). ISPI measurements determine the position of the aperture plate 30 with respect to the backside reference marks 22 in both the full-field-calibration position and the exposure position.

Figure 7:
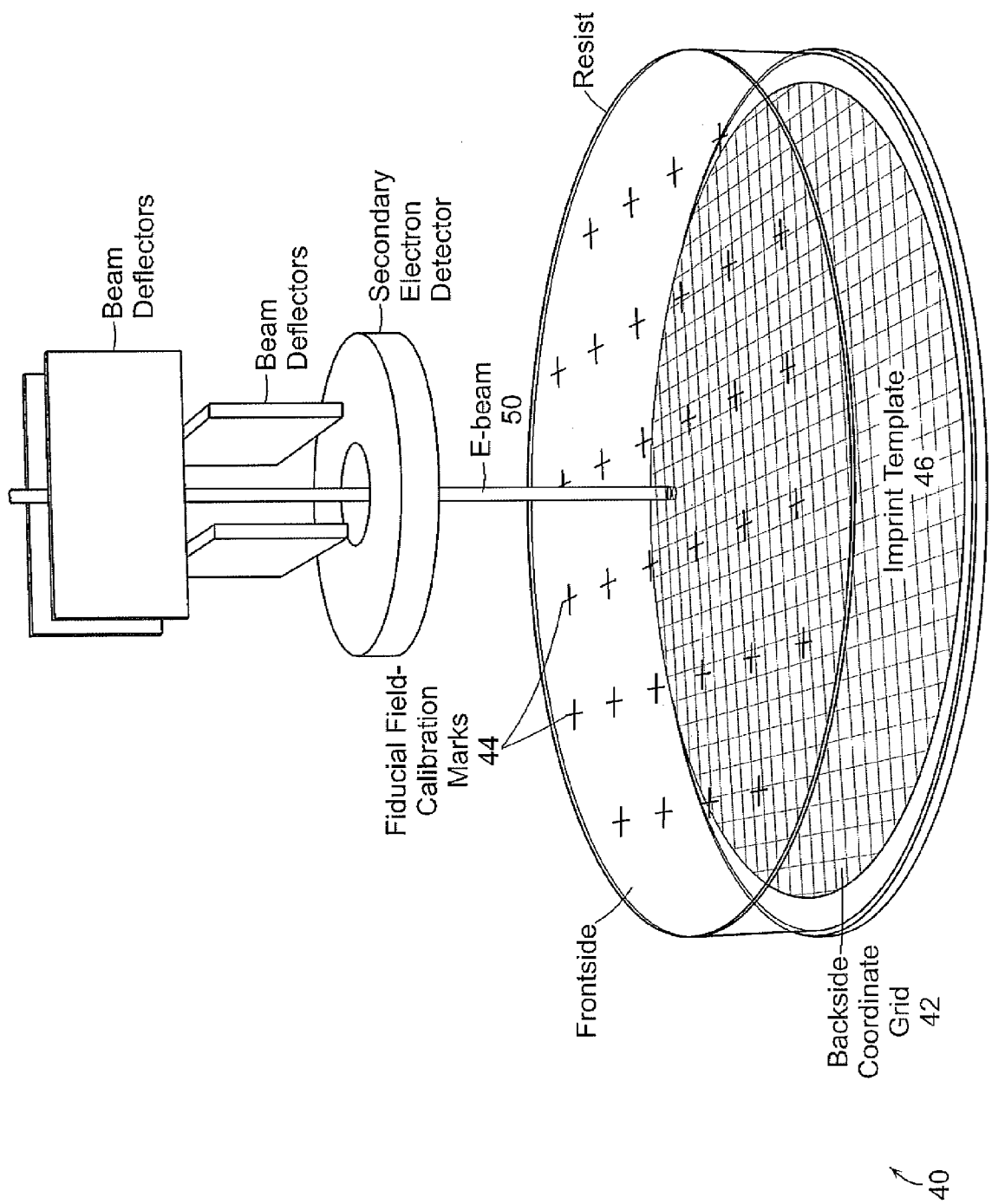
FIG. 7 is a schematic diagram illustrating another embodiment of the electron-beam position control used in accordance with the invention.

In another embodiment, an arrangement 40 using backside-referenced scanning tip to write fiducial patterns 44 on the front surface of a template or wafer 46 is provided, as illustrated in FIG. 7, which are used as real-time field-calibration marks for the electron beam 50. The only difference between arrangement 20 of FIG. 6 and arrangement 40 is the use of frontside fiducial marks 44. The frontside marks 44 permit continuous referencing of the scanning beam 50 position to the fiducial pattern 44, which is position locked to the backside marks 42 via the scanning tip lithography. Frontside fiducial marks 44 can be used in conjunction with a ISPI-controlled aperture plate as well.

The backside coordinate grid provides a common global reference for both scanning-tip and e-beam lithographies. In this manner, patterns written by both scanning-tip and e-beam can be interleaved, and positioned with nanometer precision over the entire template or wafer surface.

The invention is a technique for measuring and controlling the position of multiple lithographic instruments with respect to a global coordinate system attached to a substrate, detected by means of interferometric-spatial-phase imaging (ISPI). In the preferred embodiment, a global coordinate system is implemented through a checkerboard mark on the back surface of the substrate. Lithography is performed on the front surface of substrates, and is independent of the back surface mark. The back surface mark is unaffected by multiple lithographic steps and processes that modify the front surface.

The invention enables feature placement at the 1-nm level by both electron-beam lithography and scanning-tip lithography. Scanning-tip lithography may be slower than electron-beam lithography, but has the advantage of writing small feature sizes that are inaccessible to e-beam lithography, and avoids issues of shot noise and damage to the substrate. The invention provides a versatile approach to lithography that combines nanometer placement precision, relatively high speed, and sub-10 nm feature resolution, including patterning of few-to-single molecular features. A significant application is to fabrication of imprint templates with sub-10 nm features.

The same position detection technology is applicable to both mix-and-match template lithography and template-wafer overlay in an imprint process. As is apparent to one versed in the art, the global backside position reference system can also be extended to other forms of lithography, such as optical or ion-beam lithography.

Although the present invention has been shown and described with respect to several preferred embodiments thereof, various changes, omissions and additions to the form and detail thereof, may be made therein, without departing from the spirit and scope of the invention.

What is claimed is:

1. An interferometric-spatial-phase imaging (ISPI) system comprising:
   a substrate wafer;
   an alignment configuration permanently embedded in said substrate wafer, said alignment configuration uses a global coordinate reference system by providing a plurality of global reference marks that encompass up to the entire substrate wafer; and
   a plurality of alignment markings on a surface in close proximity to said alignment configuration for obtaining continuous six-axis control to provide positional information of a scanning probe tip or an electron beam with respect to said global coordinate reference system, wherein said global reference marks are illuminated with light at a wavelength to which the substrate wafer is transparent or illuminated with infrared light in the silicon transparency band.

2. The ISPI system of claim 1, wherein said alignment configuration provides zero global reference marks for alignment marks on the frontside of said substrate wafer.

3. The ISPI system of claim 1, wherein said global reference marks are not subject to degradation during frontside processing.

4. The ISPI system of claim 1, further comprising a one or more checkerboard marks for providing a plurality of complementary alignment marks.

5. The ISPI system of claim 1, wherein said global reference marks comprise nanometer spatial accuracy over the entire wafer.

6. The ISPI system of claim 1, wherein said global reference marks, in combination with a plurality of periodic marks on a surface in close proximity, generate interferometric fringes by means of diffraction.

7. The ISPI system of claim 1, wherein said global reference marks comprise checkerboard marks.

8. The ISPI system of claim 7, wherein said interferometric fringes are formed using infrared illumination wavelengths and are observed using an infrared-sensitive camera.

9. The ISPI system of claim 7, wherein unambiguous position information from said interferometric fringes is resolved using spatial frequency analysis of a age Page 5 variable-period, or chirped, array of backdiffracting marks embedded within the substrate wafer.

10. The ISPI system of claim 6, wherein unambiguous position information from said interferometric fringes is resolved using a plurality of periodic marks on a template.

11. A method of providing positional information for a scanning probe tip or electron beam in an interferometric-spatial-phase imaging (ISPI) system comprising:
   providing a substrate wafer;
   permanently embedding an alignment configuration in said substrate wafer, said alignment configuration uses a global coordinate reference system by providing a plurality of global reference marks that encompass up to the entire substrate wafer; and
   providing a plurality of alignment markings on a surface in close proximity to said alignment configuration for obtaining continuous six-axis control to provide positional information of said scanning probe tip or said electron beam with respect to said global coordinate reference system, wherein said global reference marks are illuminated with light at a wavelength to which the substrate wafer is transparent or illuminated with infrared light in the silicon transparency band.

12. The method of claim 11, wherein said alignment configuration provides zero global reference marks for alignment marks on the frontside of said substrate wafer.

13. The method of claim 11, wherein said global reference marks are not subject to degradation during frontside processing.

14. The method of claim 11, further comprising providing one or more checkerboard marks for providing a plurality of complementary alignment marks and a plurality of gap detection marks.

15. The method of claim 11, wherein said global reference marks comprise nanometer spatial accuracy over the entire wafer.

16. The method of claim 11, wherein said global reference marks, in combination with a plurality of periodic marks on a surface in close proximity, generate interferometric fringes by means of diffraction.

17. The method of claim 11, wherein said global reference marks comprise checkerboard marks.

18. The method of claim 16, wherein said interferometric fringes are formed using infrared illumination wavelengths and are observed using an infrared-sensitive camera.

19. The method of claim 16, wherein unambiguous position information from said interferometric fringes is resolved using spatial frequency analysis of a variable-period, or chirped, array of backdiffracting marks embedded within the substrate wafer.

20. The method of claim 16, wherein unambiguous position information from said interferometric fringes is resolved using a plurality of periodic marks on a template.

* * * * *